(12) United States Patent
Thompson et al.

(10) Patent No.: US 6,292,031 B1
(45) Date of Patent: Sep. 18, 2001

(54) LEVEL SHIFT CIRCUIT WITH COMMON MODE LEVEL CONTROL

(75) Inventors: John Thompson, Macclesfield; Raymond Filippi; Joakim Bängs, both of Swindon, all of (GB)

(73) Assignee: Telefonaktiebolaget L M Ericsson, Stockholm (SE)

(*) Notice: Subject to any disclaimer, the term of this patent is extended or adjusted under 35 U.S.C. 154(b) by 0 days.

(21) Appl. No.: 09/461,324

(22) Filed: Dec. 15, 1999

(30) Foreign Application Priority Data

Dec. 18, 1998 (GB) .................................................. 9828052

(51) Int. Cl.[7] ............................................................. H03K 5/22
(52) U.S. Cl. .................................. 327/66; 327/67; 327/63
(58) Field of Search ............................ 327/52, 54, 56, 327/65, 67, 68, 69, 71, 73, 333; 330/258, 259, 75

(56) References Cited

U.S. PATENT DOCUMENTS

| | | | |
|---|---|---|---|
| 3,491,307 | 1/1970 | Solomon et al. | 330/30 |
| 3,582,802 * | 6/1971 | Weekes | 330/258 |
| 4,105,942 | 8/1978 | Henry | 330/261 |
| 4,345,213 | 8/1982 | Schade, Jr. | 330/253 |
| 4,555,457 | 11/1985 | Dhanji | 429/199 |
| 4,560,921 * | 12/1985 | Yamatake | 327/77 |
| 4,697,152 | 9/1987 | Westwick | 330/9 |
| 4,701,719 * | 10/1987 | Nagata | 330/258 |
| 4,725,790 | 2/1988 | Addis et al. | 330/258 |
| 4,749,956 | 6/1988 | Torelli et al. | 330/253 |
| 4,906,943 | 3/1990 | Koch | 330/258 |
| 4,918,399 | 4/1990 | Devecchi et al. | 330/253 |
| 5,008,632 * | 4/1991 | Sutterline | 330/256 |
| 5,182,477 * | 1/1993 | Yamaski et al. | 327/65 |
| 5,283,535 * | 2/1994 | Sevenhans et al. | 330/253 |
| 5,334,948 | 8/1994 | Fong et al. | 330/253 |
| 5,428,316 | 6/1995 | Molnar | 330/253 |
| 5,568,089 | 10/1996 | Maru | 330/253 |
| 5,604,464 | 2/1997 | Hwang et al. | 330/253 |
| 5,825,819 | 10/1998 | Cogburn | 375/257 |
| 5,990,743 * | 11/1999 | Gabara | 330/258 |

FOREIGN PATENT DOCUMENTS

| | | |
|---|---|---|
| 0 493 335 A1 | 7/1992 | (EP) . |
| 0 516 423 a1 | 12/1992 | (EP) . |
| 0 639 889 A1 | 2/1995 | (EP) . |
| 0 840 442 A1 | 5/1998 | (EP) . |
| 2 135 548 A | 8/1984 | (GB) . |
| WO 91/07814 | 5/1991 | (WO) . |
| WO 97/05696 | 2/1997 | (WO) . |

* cited by examiner

*Primary Examiner*—Terry D. Cunningham
(74) *Attorney, Agent, or Firm*—Jenkens & Gilchrist PC (57) ABSTRACT

There is disclosed a level shift circuit which has a differential input, for receiving input signals, and a differential output, for supplying output signals derived from the input signals. The level shift circuit further includes a control level setting input, and a feedback circuit for setting a common mode level of the output signals to a level set on the control level setting input. This allows the output common mode to be set accurately, independently of the input common mode.

15 Claims, 8 Drawing Sheets

LEVEL SHIFT CIRCUIT WITH COMMON MODE LEVEL CONTROL

TECHNICAL FIELD OF THE INVENTION

This invention relates to a level shift circuit, that is, a circuit which shifts the level of an input signal to a desired common mode signal level.

BACKGROUND OF THE INVENTION

Electronic circuits often need to have circuits which can alter the common mode level of signals. Purely as an example, in current mode logic (CML) circuits, voltages are typically referenced from the most positive supply voltage. However, an analog circuit connected to such a digital CML circuit may need to have its threshold voltages referenced to the negative supply. As a result, at the digital/analog interface, there is a need for a circuit which shifts the signal level between the two voltage supply rails.

More generally, there may be a need to shift the level of a signal to an arbitrary fixed or controllable level.

JP-A-6-260925 discloses a level shift circuit, in which first and second input terminals form a differential input, for receiving a differential input voltage, and are connected to the bases of first and second NPN transistors. The collector terminals of these transistors are connected together, and the emitter terminals are connected to respective output terminals which supply a differential output voltage. The emitters of these transistors are further connected through respective resistors to respective halves of a current mirror circuit. The common mode level of the output signals (i.e. the average of the signals) is determined by the values of components in the circuit, for example the resistance values of the resistors.

An object of the present invention is to provide a level shifting circuit which, in preferred embodiments, can provide a fixed output common mode level which is independent of the supply voltage and the input common mode voltage.

SUMMARY OF THE INVENTION

According to embodiments of the present invention, there is provided a level shift circuit which has a differential input, for receiving input signals, and a differential output, for supplying output signals derived from the input signals. The level shift circuit further includes a control level setting input, and a feedback circuit for setting a common mode level of the output signals to a level set on the control level setting input.

DETAILED DESCRIPTION OF PREFERRED EMBODIMENTS

Figure 1A:
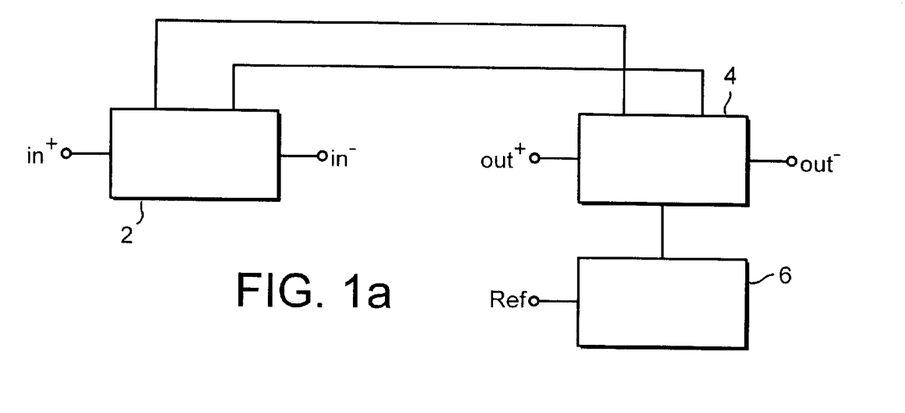
FIGS. 1a–1d are block schematic diagrams of level shift circuits in accordance with the invention.

FIG. 1a shows the general form of a level shift circuit in accordance with the invention. First and second differential input signals in+ and in− are supplied to respective inputs of a differential input circuit 2. These signals are then supplied, preferably with a controllable gain, to a differential output circuit 4, which supplies differential output signals out+ and out−. A reference signal Ref is supplied to a feedback circuit 6, which detects the common mode signal level of the differential output signals out+ and out−, and steers that signal level to a desired value which is input on the feedback circuit reference input.

Figure 1B:
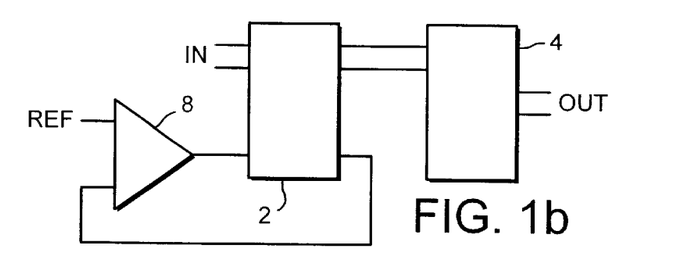

FIG. 1b is a block schematic diagram of one form of circuit in accordance with FIG. 1a. A differential input signal is applied to input terminals IN of an input differential gain stage 2, which then supplies signals to a common emitter differential output stage 4, which has circuit output terminals OUT. A reference level signal is applied to a reference input REF at one terminal of an operational amplifier 8. The other (feedback) input of the operational amplifier is supplied from the input stage 2, and the output of the operational amplifier is fed back into the input stage 2 to set a reference level.

Figure 1C:
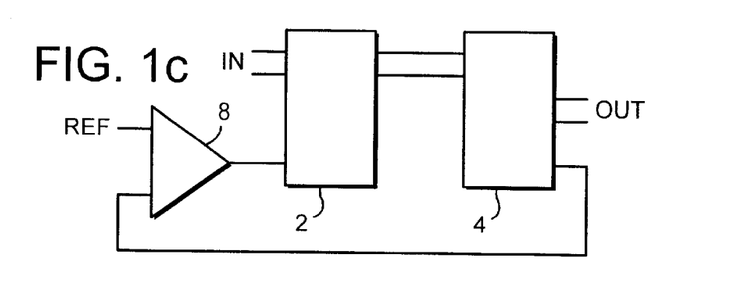

FIG. 1c is a block schematic diagram of another form of circuit in accordance with FIG. 1a. A differential input signal is applied to input terminals IN of an input differential gain stage 2, which then supplies signals to a common emitter differential output stage 4, which has circuit output terminals OUT. A reference level signal is applied to a reference input REF at one terminal of an operational amplifier 8. The other (feedback) input of the operational amplifier is supplied from the output stage 4, and the output of the operational amplifier is fed back into the input stage 2 to set a reference level.

Figure 1D:
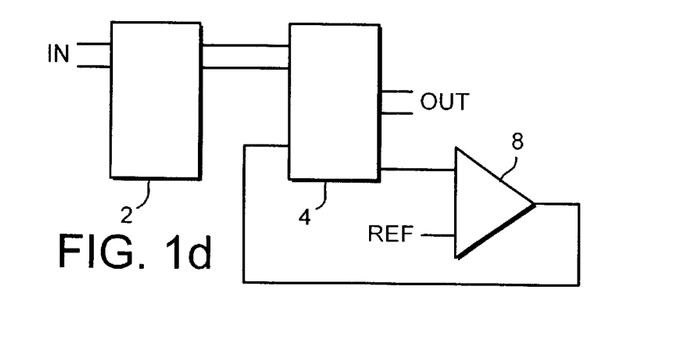

FIG. 1d is a block schematic diagram of a further form of circuit in accordance with FIG. 1a. A differential input signal is applied to input terminals IN of an input differential gain stage 2, which then supplies signals to a common emitter differential output stage 4, which has circuit output terminals OUT. A reference level signal is applied to a reference input REF at one terminal of an operational amplifier 8. The other (feedback) input of the operational amplifier is supplied from the output stage 4, and the output of the operational amplifier is fed back into the output stage 4 to set a reference level.

Figure 2:
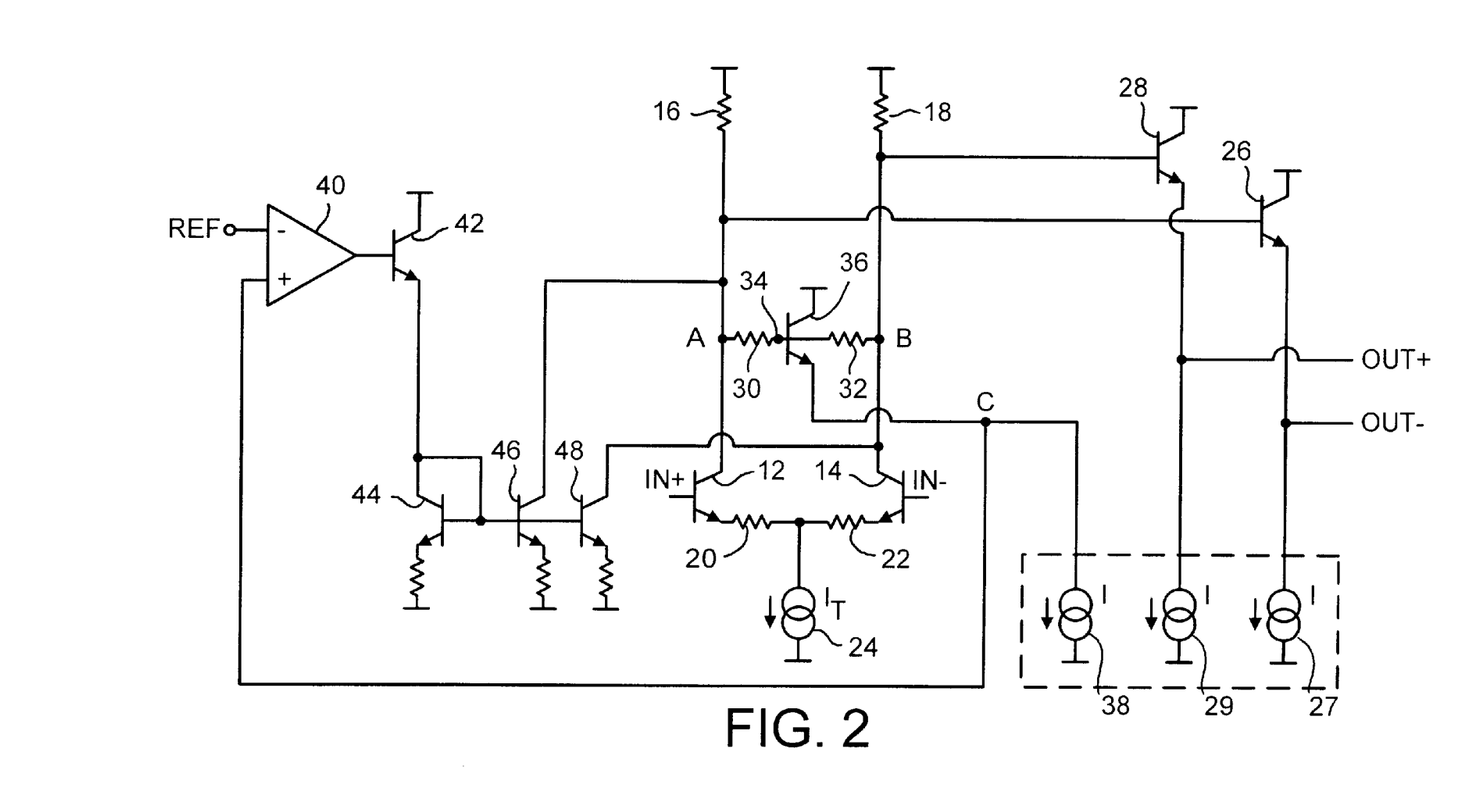
FIG. 2 is a circuit diagram of a level shift circuit in accordance with a first embodiment of the invention.

FIG. 2 is a circuit diagram showing a first circuit implementing an embodiment of the invention, of the general type shown in FIG. 1b. In the circuit of FIG. 2, a differential circuit includes two matched NPN transistors 12, 14, and the input signals in+, in− are supplied to the base terminals of those transistors. The collector terminal of transistor 12 at a node marked A is connected to a positive supply rail through a resistor 16, and the collector terminal of transistor 14 at a node marked B is connected to the positive supply rail through a resistor 18. The emitter terminal of transistor 12 is connected to a resistor 20, and the emitter terminal of transistor 14 is connected to a resistor 22. The other ends of the resistors 20, 22 are connected to ground through a current source providing a current $I_T$.

The currents drawn through transistors 12, 14, and the resistance values of resistors 16, 18 determine the voltage levels at nodes A and B. These voltages are supplied to the base terminals of respective NPN transistors 26, 28 respectively in a differential output stage of the circuit. The transistors 26, 28 have their collector terminals connected to the positive voltage supply, and their emitter terminals connected to ground through respective matched current sources 27, 29 providing currents I. Further, the voltages at the emitter terminals of the transistors 28, 26 respectively are taken as differential output signals out+, out−.

Nodes A and B are connected by a pair of resistors 30, 32, which have equal resistance values. As a result, the voltage at the node 34 between resistors 30, 32 is at the average level of the voltages at the nodes A and B. The resistance values of resistors 30, 32 should preferably be considerably higher than those of resistors 16, 18.

The node 34 is also connected to the base terminal of a further NPN transistor 36, the collector of which is connected to the positive voltage supply rail, and the emitter of which, at node C, is connected to ground through a further matched current source 38 providing a current I.

Thus, node 34 is at the average of the voltages at nodes A and B. Node C is at a voltage which is lower than that at node 34 by one transistor base-emitter voltage Vbe. Further, the output voltages out+, out− are each lower than the voltages at nodes B and A respectively by one transistor base-emitter voltage Vbe. Therefore, node C is at the common mode signal level of the differential output signals.

A feedback stage of the circuit of FIG. 1 includes an operational amplifier 40, which includes a reference signal Ref on the inverting input thereof. The voltage at node C is fed back to the non-inverting input of the operational amplifier 40, and the output thereof is supplied to the base terminal of an NPN transistor 42. The collector terminal of the transistor 42 is connected to the positive voltage supply, and the emitter terminal is connected to a current mirror circuit, which includes a diode-connected NPN transistor 44, and further NPN transistors 46, 48. The collector terminal of transistor 44 is connected to the emitter terminal of transistor 42. The emitter terminals of transistors 44, 46, 48 are connected to ground, either through resistors as shown, or directly. The collector terminal of transistor 46 is connected to node A, and the collector terminal of transistor 48 is connected to node B. The transistors 46, 48 are matched, and may have the same emitter areas as transistor 44, so that the currents therethrough mirror exactly the current in transistor 44, or may have scaled emitter areas, so that the currents therethrough are more appropriate in the light of the available voltage headroom or the required power dissipation properties of the circuit.

In use of the circuit of FIG. 2, when there is no differential input signal, i.e. in+=in−, the currents through the input transistors 12, 14 will be equal, and the voltages at nodes A and B (which are Vbe higher than the equal output voltages out+ and out−) will be equal, and will also be equal to the voltage at node 34. This voltage is Vbe higher than the voltage at node C, which is fed back to the non-inverting input of the amplifier 40. If the feedback voltage becomes higher than the input signal Ref, the currents drawn through transistor 42, and hence through transistors 46 and 48 will increase. These increase the currents drawn through resistors 16 and 18, and hence reduce the voltages at nodes A and B, thereby bringing the voltage at node C back towards the input signal Ref. Conversely, if the feedback voltage becomes lower than the input signal Ref, the currents drawn through transistor 42, and hence through transistors 46 and 48 will fall. These reduce the currents drawn through resistors 16 and 18, and hence increase the voltages at nodes A and B, thereby again bringing the voltage at node C back towards the input signal Ref.

When a differential signal is applied to the input terminals in+ and in−, the currents through the respective transistors 12, 14 will become different, and hence the voltages at nodes A and B will become different. The difference between these voltages is equal to the difference between the output voltages out+ and out−. When divided by the differential input voltage, this can be regarded as the gain of the circuit, and will depend on the circuit values. In particular, the current source 24 and resistance values of resistors 20, 22 can be chosen to set the gain (or attenuation) to any desired value.

However, even when a differential signal is applied, any increase or decrease in the voltage at node A is balanced by a corresponding decrease or increase in the voltage at node B. Thus, the voltage at node 34, and hence at node C, and hence the output common mode voltage, remains constant.

Figure 3:
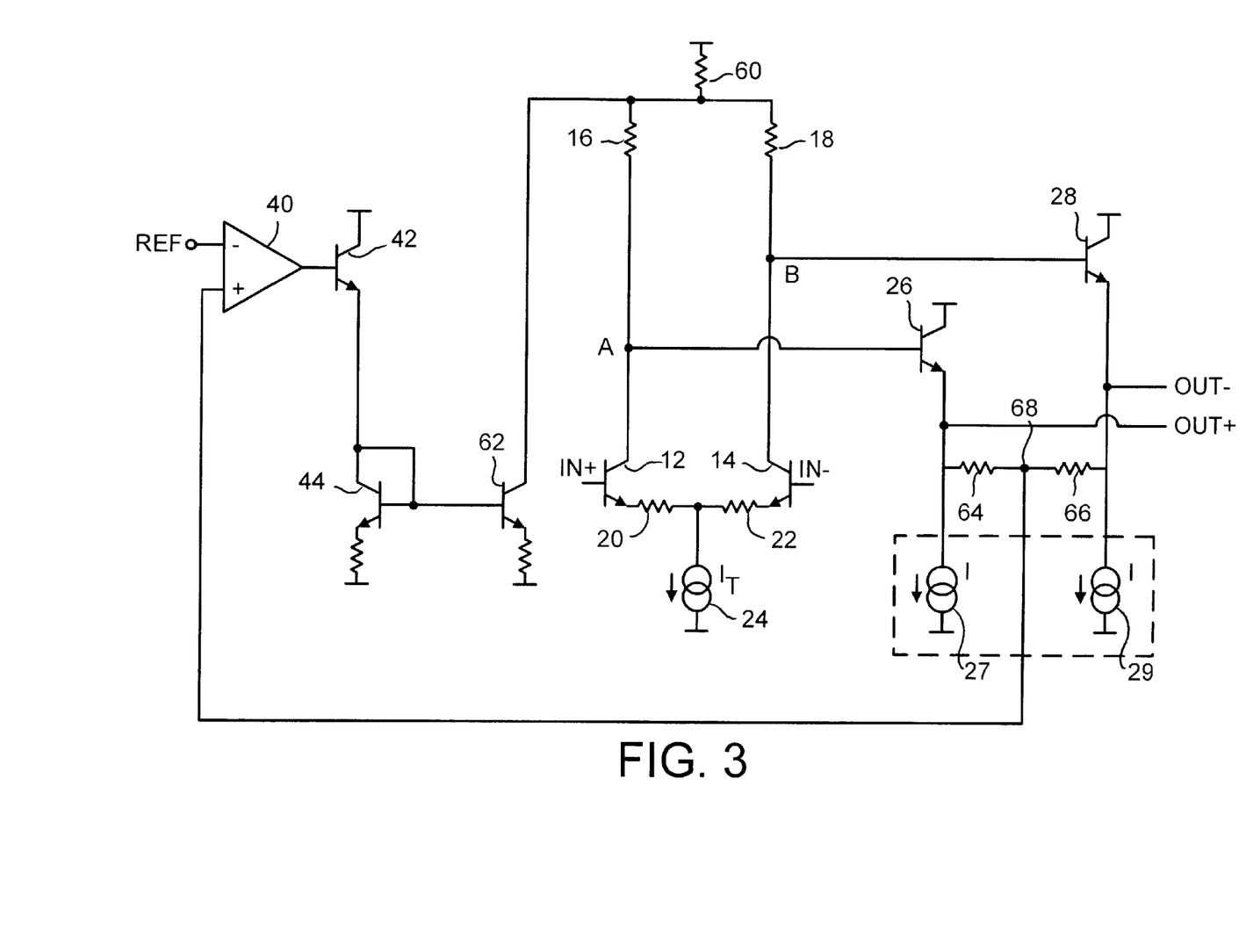
FIG. 3 is a circuit diagram of a level shift circuit in accordance with a second embodiment of the invention.

FIG. 3 is a circuit diagram showing a second circuit implementing an embodiment of the invention of the general type shown in FIG. 1c. Components of the circuit having the same functions as corresponding components of the circuit of FIG. 2 are indicated by the same reference numerals, and will not be described further herein.

In the circuit of FIG. 3, the nodes A and B are connected to the positive voltage supply rail not only through the respective resistors 16, 18, but also through a further resistor 60. In the feedback circuit, the current through the resistor, and hence the voltage at the nodes A and B, is controlled by a single transistor 62, which forms a current mirror with the diode-connected transistor 44.

Also in the feedback circuit, the output common mode voltage is detected, not indirectly as in FIG. 2, but directly at the circuit outputs. Thus, a pair of equal valued resistors 64, 66 is connected between the input and output terminals. The voltage at the connection node 68 between them is the average of the outputs at any time, i.e. the output common mode voltage, and this is fed back to the non-inverting input of the amplifier 40.

Figure 4:
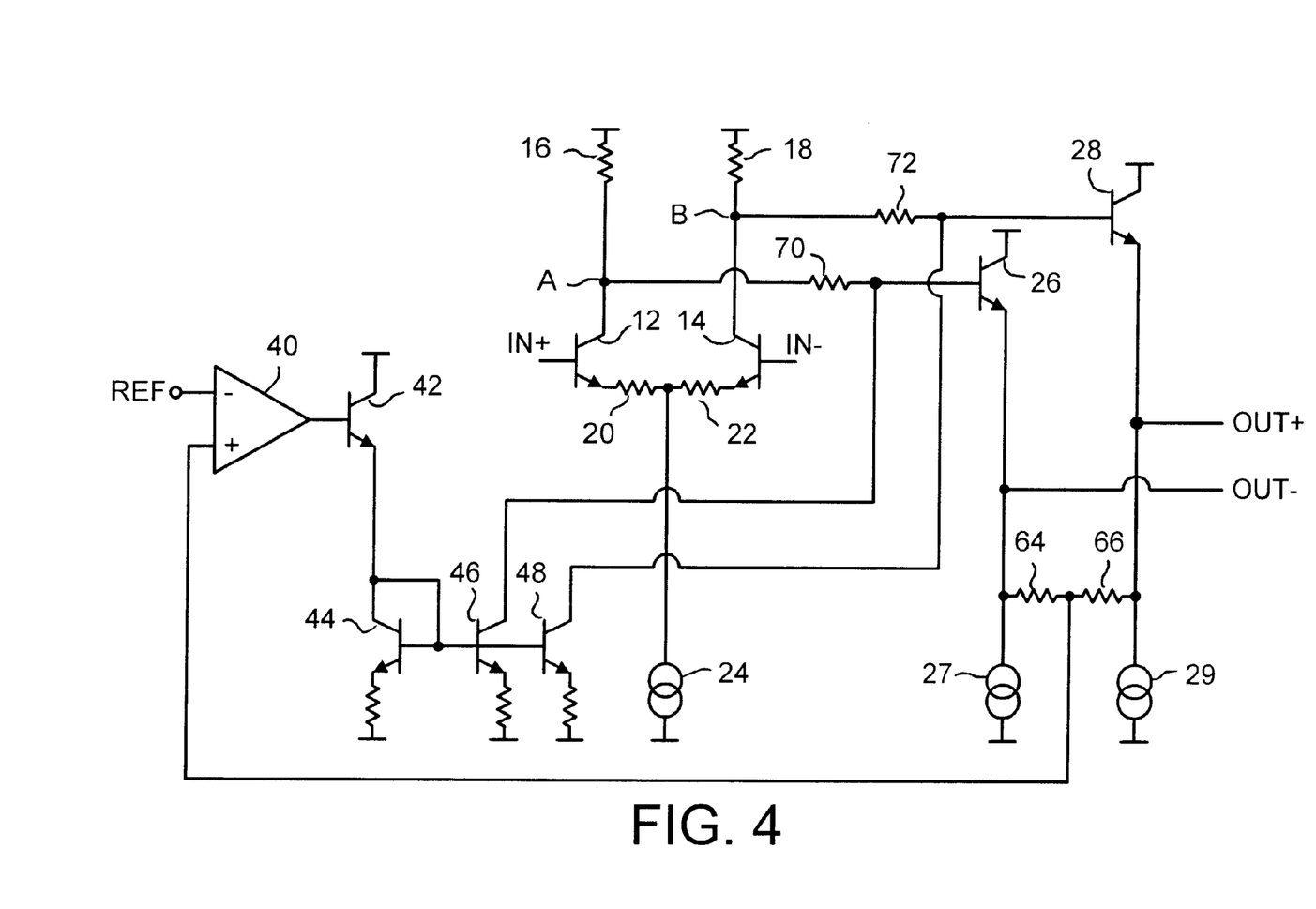
FIG. 4 is a circuit diagram of a level shift circuit in accordance with a third embodiment of the invention.

FIG. 4 is a circuit diagram showing a third circuit implementing an embodiment of the invention of the general type shown in FIG. 1c. Components of the circuit having the same functions as corresponding components of the circuits of FIG. 2 or FIG. 3 are indicated by the same reference numerals, and will not be described further herein.

In the circuit of FIG. 4, the feedback currents, drawn by transistors 46, 48, pass not only through differential stage resistors 16, 18, as in FIG. 2, but also through a first additional resistor 70 connected between node A and the base of transistor 26, and a second additional resistor 72 connected between node B and the base of transistor 28. The effect of this is to allow more headroom for transistors 12, 14, without the risk of them running into saturation. The circuit is thus able to handle larger differential input signals and higher input common mode voltages.

Figure 5:
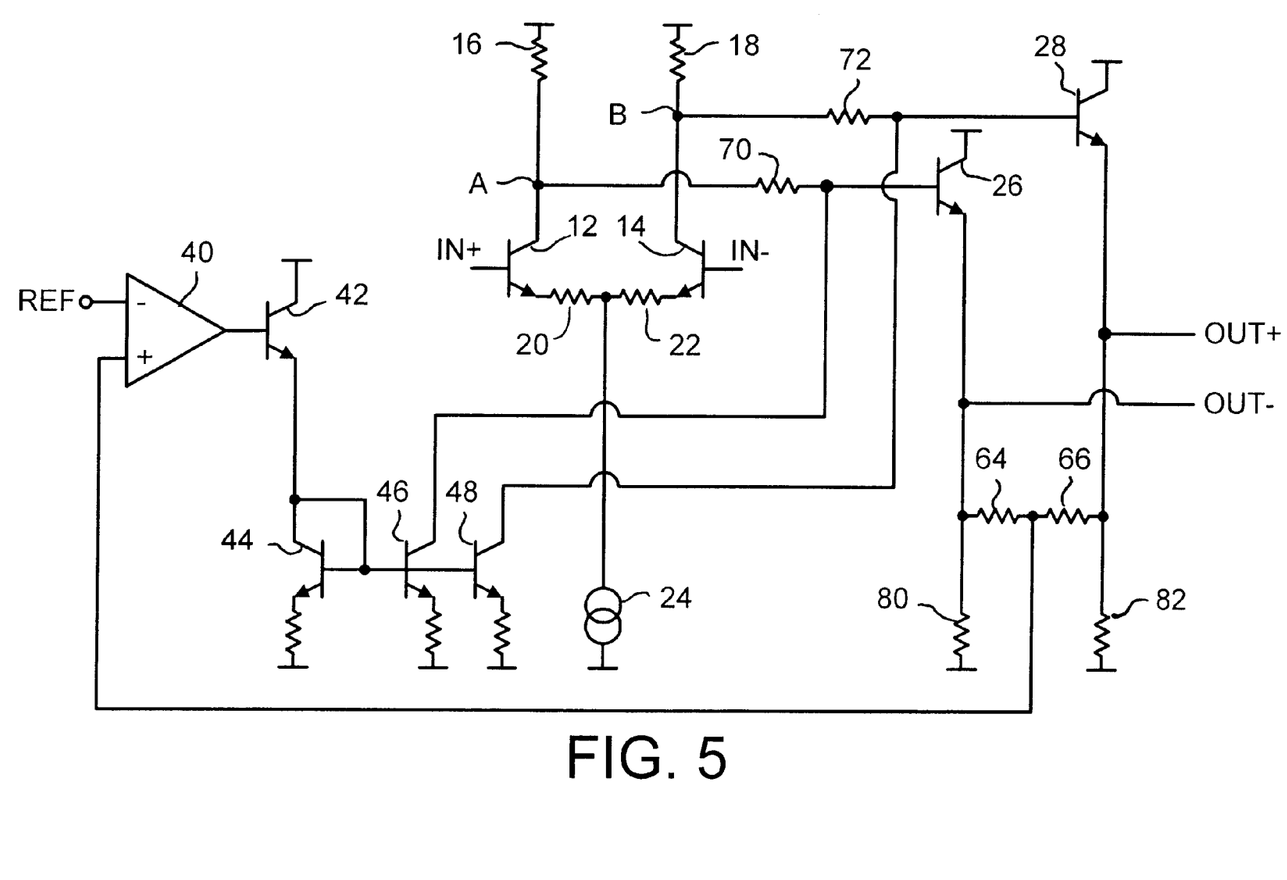
FIG. 5 is a circuit diagram of a level shift circuit in accordance with a fourth embodiment of the invention.

FIG. 5 is a circuit diagram showing a fourth circuit implementing an embodiment of the invention of the general type shown in FIG. 1c. Components of the circuit having the same functions as corresponding components of the circuit of FIG. 4 are indicated by the same reference numerals, and will not be described further herein.

In the circuit of FIG. 5, rather than current sources, resistors 80 and 82 are connected between the output terminals, out− and out+ respectively, and ground. This allows the output common mode voltage to be lower, and close to the negative supply rail.

Figure 6:
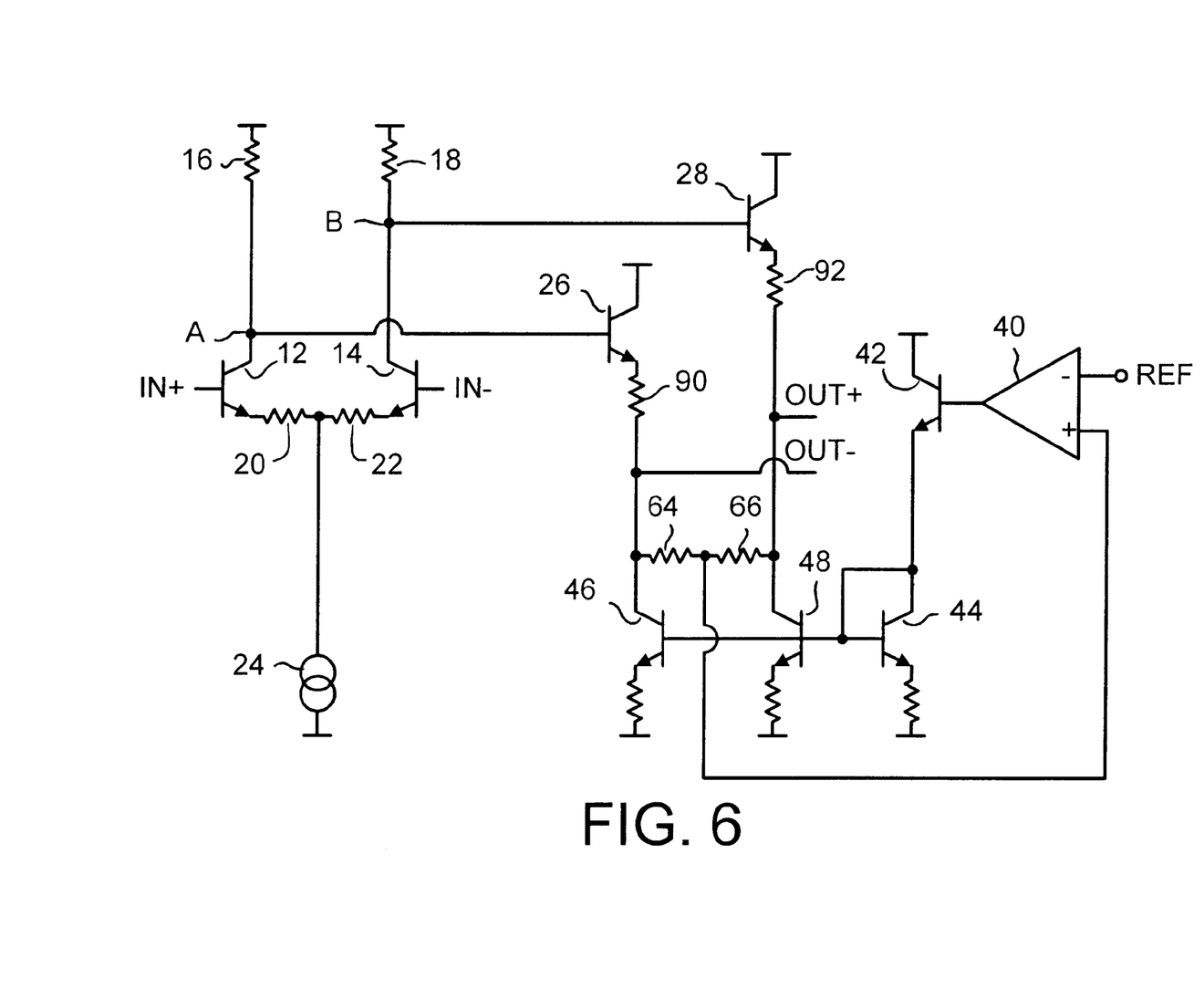
FIG. 6 is a circuit diagram of a level shift circuit in accordance with a fifth embodiment of the invention.

FIG. 6 is a circuit diagram showing a fifth circuit implementing an embodiment of the invention of the general type shown in FIG. 1d. Components of the circuit having the same functions as corresponding components of the circuits of FIG. 5 are indicated by the same reference numerals, and will not be described further herein.

In the circuit of FIG. 6, the feedback circuit is moved to draw current through the transistors 26 and 28, rather than through differential stage resistors 16, 18, as in FIG. 2. Thus, a resistor 90 is connected between the emitter of transistor 26 and the output out−, the latter also being connected to the collector terminal of transistor 46. Further, a resistor 92 is connected between the emitter of transistor 28 and the output out+, the latter also being connected to the collector terminal of transistor 48. This has the effect of further increasing the headroom available for the differential stage transistors 20, 22, because the only feedback currents drawn through the differential stage resistors 16, 18 are the base currents of the transistors 26, 28.

Figure 7:
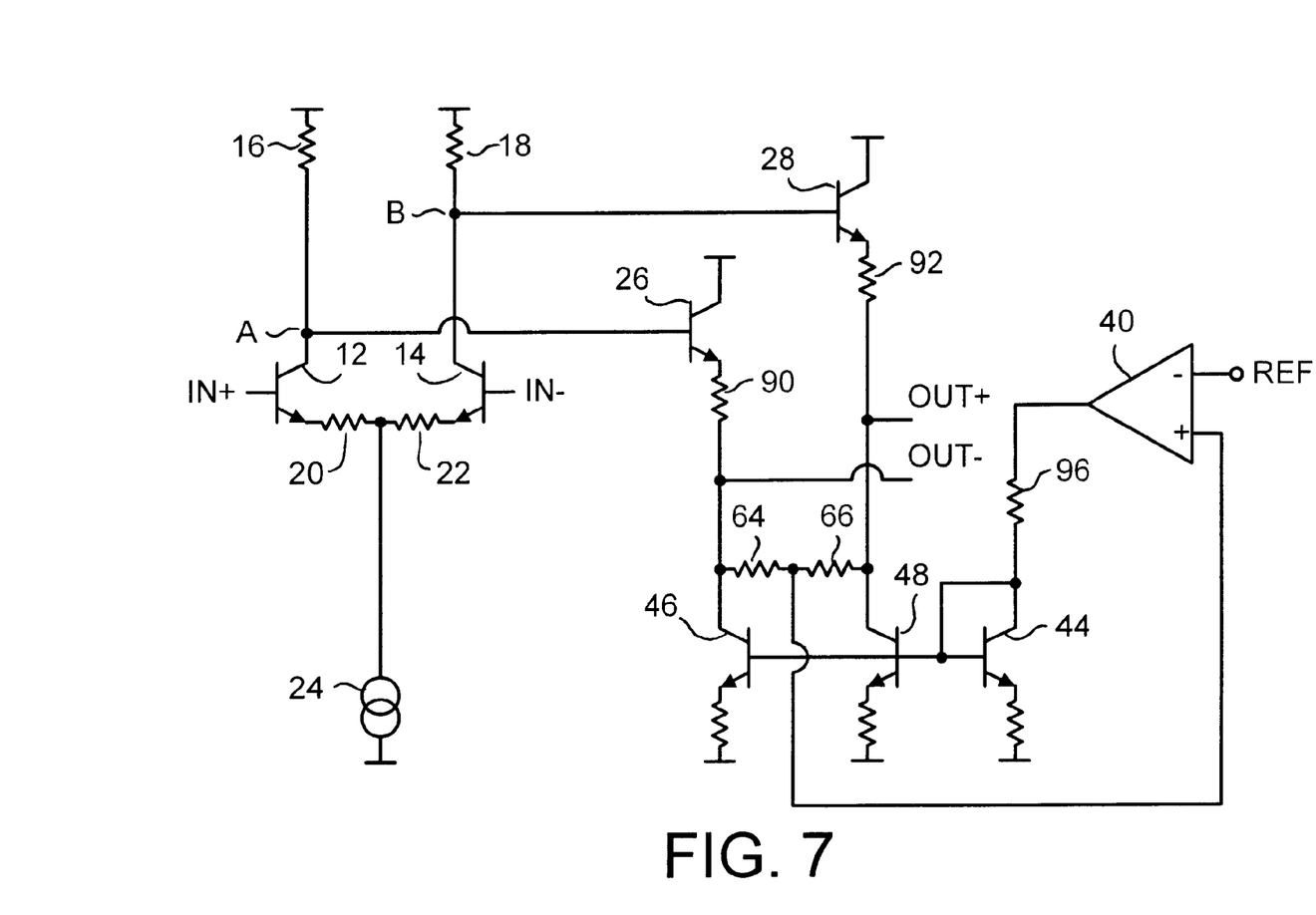
FIG. 7 is a circuit diagram of a level shift circuit in accordance with a sixth embodiment of the invention.
Figure 8:
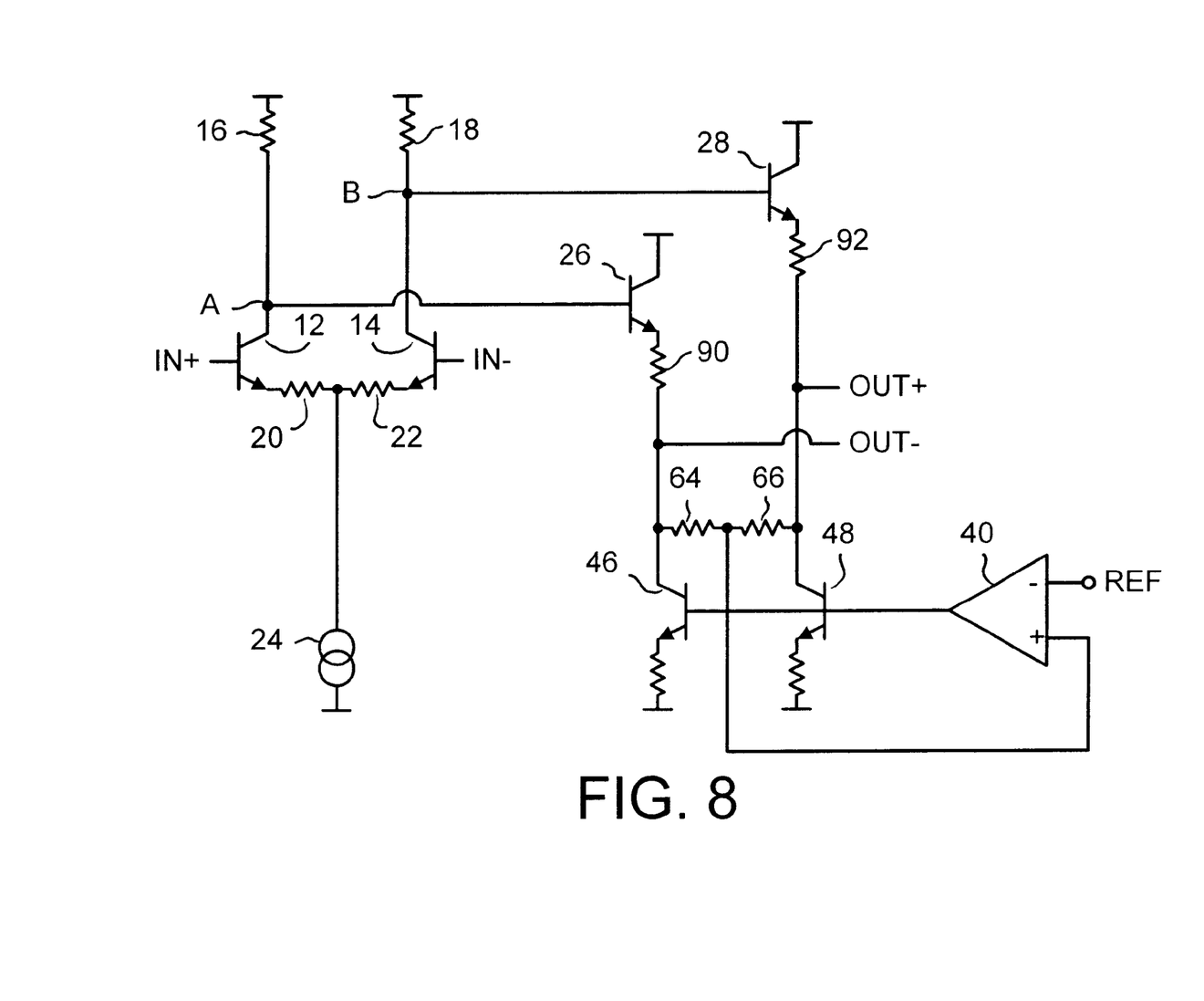
FIG. 8 is a circuit diagram of a level shift circuit in accordance with a seventh embodiment of the invention.

FIGS. 7 and 8 are circuit diagrams showing sixth and seventh circuits implementing embodiments of the invention of the general type shown in FIG. 1d. Components of the circuit having the same functions as corresponding components of the circuits of FIG. 6 are indicated by the same reference numerals, and will not be described further herein.

In the circuit of FIG. 7, the output of the amplifier 40 is connected to a resistor 96, the other end of which is connected to the base and collector terminals of the diode-connected transistor 44.

In the circuit of FIG. 8, the output of the amplifier 40 is connected directly to the base terminals of transistors 46, 48.

Thus, in the illustrated embodiments of the invention, the output common mode voltage is completely independent of the input common mode voltage and can be set by the reference input signal Ref to any desired value, which is compatible with the headroom requirements of the circuit, and which suits the circuit being driven by the output voltages.

This level may be fixed or may vary. For example, the output common mode voltage may be set to have a known temperature coefficient. Further, the output common mode voltage reference may be an AM or FM signal source, or it could itself be switched, thereby providing a multi-common-mode level upon which input data can be superimposed.

Further, in different embodiments of the invention, the output common mode voltage may be either more positive or more negative than the input common mode voltage.

The absolute voltage levels are limited only to that which the selected monolithic process technology can withstand. Thus, the invention is applicable to both high and low voltage systems.

The circuits illustrated herein are implemented using NPN transistors, which have the advantage that high speed level shifting rates can be used. However, it will be appreciated that the circuits could also be implemented using NMOS transistors. Moreover, the invention could be implemented using PNP or PMOS devices, by reversing the polarity of the whole circuit, as is well known.

What is claimed is:

1. A level shift circuit, comprising:
a differential input circuit, having first and second input terminals for receiving first and second input signals, and first and second output terminals, and applying a gain to signals applied to the first and second input terminals;
a differential output circuit, comprising first and second transistors, the first and second transistors having their respective base terminals connected to the first and second output terminals of the differential input circuit, and having respective first and second output terminals at emitters of the first and second transistors, such that, in use, a differential voltage signal appearing between the first and second output terminals of the differential output circuit is related to a voltage signal appearing between the first and second input terminals of the differential input circuit;
a control input, for receiving a level setting input signal having a known value;
a voltage divider, connected between the output terminals of the differential input circuit, to provide a signal representative of an average level of voltage signals appearing on the first and second output terminals of the differential output circuit; and
a feedback circuit including an operational amplifier having first and second inputs, wherein said signal representative of the average level of voltage signals appearing on the first and second output terminals of the differential output circuit is applied to said first input, wherein the level setting input signal is applied to said second input, and wherein an output from the operational amplifier is applied to the differential input circuit to maintain the average level of voltage signals appearing on the first and second output terminals of the differential output circuit at said known value.

2. The level shift circuit as claimed in claim 1, wherein the differential input circuit comprises a first pair of bipolar transistors which receive the input signals on their respective base terminals, and the emitter terminals of which are connected together.

3. The level shift circuit as claimed in claim 1, wherein the level setting input signal is a modulating signal.

4. The level shift circuit as claimed in claim 1, wherein the base terminals of the first and second transistors are connected to the first and second output terminals of the differential input circuit through respective resistors.

5. The level shift circuit as claimed in claim 1, further comprising a third transistor connected to the voltage divider, such that a signal appearing on an emitter of the third transistor is related to the average level of voltage signals appearing on the first and second output terminals of the differential output circuit, in the same way that the signals appearing on the first and second output terminals of the differential output circuit are related to the signals appearing on the first and second output terminals of the differential input circuit, respectively,
the signal appearing on the emitter of the third transistor being supplied to the first input of the operational amplifier.

6. A level shift circuit, comprising:
a differential input circuit, having first and second input terminals for receiving first and second input signals, and first and second output terminals, and applying a gain to signals applied to the first and second input terminals;
a differential output circuit, comprising first and second transistors, the first and second transistors having their respective base terminals connected to the first and second output terminals of the differential input circuit, and having respective first and second output terminals at emitters of the first and second transistors, such that, in use, a differential voltage signal appearing between the first and second output terminals of the differential output circuit is related to a voltage signal appearing between the first and second input terminals of the differential input circuit;

a control input, for receiving a level setting input signal having a known value;

a feedback circuit including an operational amplifier having first and second inputs, wherein a signal representative of an average level of voltage signals appearing on the first and second output terminals of the differential output circuit is applied to said first input, the level setting input signal is applied to said second input, and an output from the operational amplifier is applied to the differential input circuit to maintain the average level of voltage signals appearing on the first and second output terminals of the differential output circuit at said known value;

characterized in that the base terminals of the first and second transistors are connected to the first and second output terminals of the differential input circuit through respective resistors.

7. The level shift circuit as claimed in claim 6, wherein the differential input circuit comprises a first pair of bipolar transistors which receive the input signals on their respective base terminals, and the emitter terminals of which are connected together.

8. The level shift circuit as claimed in claim 6, wherein the level setting input signal is a modulating signal.

9. The level shift circuit as claimed in claim 6, wherein the feedback circuit further comprises a voltage divider connected between the output terminals of the differential output circuit, to provide said signal representative of an average level of voltage signals appearing on the first and second output terminals of the differential output circuit.

10. The level shift circuit as claimed in claim 6, wherein the feedback circuit further comprises a voltage divider connected between the output terminals of the differential input circuit, to provide said signal representative of an average level of voltage signals appearing on the first and second output terminals of the differential output circuit.

11. A level shift circuit, comprising:

a differential input circuit, having first and second input terminals for receiving first and second input signals, and first and second output terminals, and applying a gain to signals applied to the first and second input terminals;

a differential output circuit, comprising first and second transistors, the first and second transistors having their respective base terminals connected to the first and second output terminals of the differential input circuit, and having respective first and second output terminals at emitters of the first and second transistors, such that, in use, a differential voltage signal appearing between the first and second output terminals of the differential output circuit is related to a voltage signal appearing between the first and second input terminals of the differential input circuit;

a control input, for receiving a level setting input signal having a known value;

a feedback circuit including an operational amplifier having first and second inputs, wherein a signal representative of an average level of voltage signals appearing on the first and second output terminals of the differential output circuit is applied to said first input, the level setting input signal is applied to said second input, and an output from the operational amplifier is applied to the differential input circuit to maintain the average level of voltage signals appearing on the first and second output terminals of the differential output circuit at said known value, characterized in that the emitters of the first and second transistors are connected to the first and second output terminals of the differential output circuit through respective resistors.

12. The level shift circuit as claimed in claim 11, wherein the differential input circuit comprises a first pair of bipolar transistors which receive the input signals on their respective base terminals, and the emitter terminals of which are connected together.

13. The level shift circuit as claimed in claim 11, wherein the level setting input signal is a modulating signal.

14. The level shift circuit as claimed in claim 11, wherein the feedback circuit further comprises a voltage divider connected between the output terminals of the differential output circuit, to provide said signal representative of an average level of voltage signals appearing on the first and second output terminals of the differential output circuit.

15. The level shift circuit as claimed in claim 11, wherein the feedback circuit further comprises a voltage divider connected between the output terminals of the differential input circuit, to provide said signal representative of an average level of voltage signals appearing on the first and second output terminals of the differential output circuit.

* * * * *